(12) United States Patent
Lee

(10) Patent No.: US 8,816,360 B2
(45) Date of Patent: Aug. 26, 2014

(54) MULTI-CHIP PACKAGE CROSS-REFERENCE TO RELATED APPLICATIONS

(75) Inventor: Seung Yeop Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 91 days.

(21) Appl. No.: 13/555,539

(22) Filed: Jul. 23, 2012

(65) Prior Publication Data

US 2013/0099256 A1   Apr. 25, 2013

(30) Foreign Application Priority Data

Oct. 21, 2011   (KR) .......................... 10-2011-0108306

(51) Int. Cl.
*H01L 27/15*  (2006.01)
*H01L 29/16*  (2006.01)
*H01L 31/12*  (2006.01)
*H01L 33/00*  (2010.01)

(52) U.S. Cl.
USPC ..................... 257/82; 257/686; 257/E33.077

(58) Field of Classification Search
USPC ............................................... 257/82; 385/14
See application file for complete search history.

(56) References Cited

U.S. PATENT DOCUMENTS 5,198,684 A * 3/1993 Sudo .............................. 257/79

\* cited by examiner

*Primary Examiner* — W. Wendy Kuo
*Assistant Examiner* — Shaka White
(74) *Attorney, Agent, or Firm* — William Park & Associates Patent Ltd.

(57) ABSTRACT

A multi-chip package includes a lower substrate; at least two semiconductor chips stacked over the lower substrate and each defined with a via hole; an upper substrate coupled to a semiconductor chip positioned uppermost among the semiconductor chips; a light emitting part coupled to the lower substrate corresponding to the via hole; an electrowetting liquid lens coupled to a lower surface of the upper substrate for receiving a signal transferred from the light emitting part through the via hole; a light receiving part coupled to a sidewall of the via hole of each semiconductor chip configured to receive a signal from the electrowetting liquid lens.

9 Claims, 4 Drawing Sheets

US 8,816,360 B2

MULTI-CHIP PACKAGE

CROSS-REFERENCE TO RELATED APPLICATIONS

The present application claims priority to Korean patent application number 10-2011-0108306 filed on Oct. 21, 2011, which is incorporated herein by reference in its entirety.

BACKGROUND

1. Technical Field

The present invention relates to a multi-chip package, and, to a multi-chip package which adopts an electrowetting liquid lens for allowing chip selection to be easily performed by changing the focus of the lens.

In the semiconductor industry, packaging technologies for integrated circuits have continuously been developed to satisfy the demand toward miniaturization and mounting reliability. For example, the demand toward miniaturization has expedited the development of technologies for a package with a size approaching to that of a chip, and the demand toward mounting reliability has highlighted the importance of packaging technologies for improving the efficiency of mounting work and mechanical and electrical reliability after mounting.

2. Related Art

As miniaturization and high performance are demanded in electric and electronic products, various technologies for providing a semiconductor package of high capacity have been researched and developed. A method for providing a semiconductor package of high capacity includes the high integration of a memory chip. Such high integration can be realized by integrating an increased number of cells in a limited space of a semiconductor chip.

However, the high integration of a memory chip requires technologies having a high amount precision. These high precision technologies may include the implementation of a fine line width, and a lengthy development period. Under these situations, a stacking technology has been suggested as another method for providing a semiconductor package of high capacity.

The stacking technology is divided into a method of embedding two stacked chips into one package and a method of stacking two separate packages which are independently packaged. Nevertheless, the method of stacking two separate packages has limitations in terms of the height of a resultant semiconductor package when considering the trend toward miniaturization of electric and electronic products.

Therefore, research for a stack package or a multi-chip package in which two or three chips are embedded in one package has been actively conducted.

Meanwhile, a stacked package requires a technology for selecting any one semiconductor chip to be driven among a plurality of semiconductor chips.

For example, the following methods may be used in order to select any one semiconductor chip from in a stacked package; a method for manufacturing semiconductor chips included in each semiconductor package to have different structures, a method for forming different redistribution lines on semiconductor chips with the same structure, or a method of arranging semiconductor chips in a step-like shape and disposing conductive wires on the respective chips to have different arrangements.

However, a method for electrically connecting a substrate and respective semiconductor chips using wires has been generally known in the art. This method has various problems as described below.

First, since wire bonding processes should be performed when stacking each semiconductor chip, a UPH (unit per hour) is reduced, and the number of wires and the number of bonding processes performed therefor serve as a factor that increases the manufacturing cost.

Second, as the thickness of a semiconductor chip gradually decreases, a fail such as bouncing or a crack due to warpage of the semiconductor chip is likely to occur when performing the wire bonding process, and when performing a molding process, wires are likely to be short-circuited due to a wire sweeping phenomenon.

Third, in a structure in which long wires are needed depending upon the number of semiconductor chips to be stacked and a flip chip package is adopted, difficulties exist in transferring electrical signals, and thus, limitations are caused in realizing a high density stack type semiconductor package.

According to these facts, recently, in order to overcome the problems caused in a stack package using metal wires, preventing the electrical characteristics of the stack package from deteriorating and enable miniaturization, research for a stack package using through-silicon vias (TSVs) has been actively conducted.

When stacking individual semiconductor chips in a stack package using TSVs, adhesives are interposed between the TSVs of the semiconductor chips which are brought into contact with each other, and a liquid phase filler is filled in the space between the semiconductor chips excluding the adhesives through an underfill process, by which the respective semiconductor chips are electrically and physically connected with each other.

However, even in the conventional stack packages using through-silicon vias, in order to select a specified semiconductor chip among a plurality of semiconductor chips, via patterns for chip selection should be formed in conjunction with the number of semiconductor chips to be stacked. If a plurality of via patterns is required for chip selection, difficulties are likely to be caused in terms of process and design.

BRIEF SUMMARY OF THE INVENTION

An embodiment of the present invention is directed to a multi-chip package which adopts an electrowetting liquid lens to allow selection of a semiconductor chip among a plurality of semiconductor chips to be easily performed by changing the focus of the lens.

In one embodiment of the present invention, a multi-chip package may include: a lower substrate; at least two semiconductor chips stacked over the lower substrate and each defined with a via hole; an upper substrate coupled to a semiconductor chip positioned uppermost among the semiconductor chips; a light emitting part coupled to the lower substrate corresponding to the via hole; an electrowetting liquid lens coupled to a lower surface of the upper substrate for receiving a signal transferred from the light emitting part through the via hole; a light receiving part coupled to a sidewall of the via hole of each semiconductor chip configured to receive a signal from the electrowetting liquid lens.

The multi-chip package may further include a controller configured to control a voltage applied to the electrowetting liquid lens.

The upper substrate and the lower substrate may include at least one of a printed circuit board and a silicon substrate having circuit patterns.

The lower substrate may be formed of a flexible substance.

The multi-chip package may further include external connection terminals coupled to the lower substrate.

The external connection terminals may include solder balls.

The light emitting part may include an infrared sensor.

The light receiving part may include an infrared sensor.

The via holes may be substantially the same size.

DESCRIPTION OF EMBODIMENTS

In the present invention, a liquid lens capable of easily changing focus depending upon an applied voltage, and a light emitting part and a light receiving part may be applied to a multi-chip package so that signal transfer may be carried out according to a chip selection, whereby a semiconductor chip, preferred among a plurality of stacked semiconductor chips, may be easily selected. Furthermore, since light may be used for signal transfer, noise generation may be considerably decreased in comparison with electrical signals, and thus, the signal transfer speed may be improved.

Moreover, in the present invention, because a semiconductor chip may be selected through signal transfer by liquid lens and light, the use of via patterns may be decreased, when comparing this to conventional methods. Accordingly, the manufacturing procedure of a package may be simplified.

Hereafter, various embodiments of the present invention will be described in detail with reference to the accompanying drawings.

The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
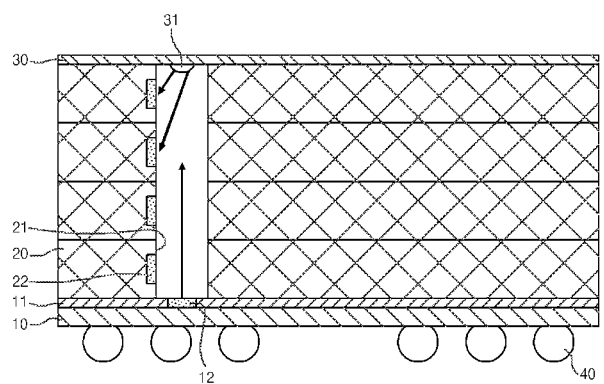
FIG. 1 is a cross-sectional view illustrating a stacked semiconductor package in accordance with an, example of an embodiment of the present invention.

Referring to FIG. 1, a multi-chip package in accordance with an embodiment of the present invention may include a lower substrate 10, semiconductor chips 20, an upper substrate 30, and external connection terminals 40.

The lower substrate 10 may have an upper surface and a lower surface which may face away from the upper surface. For example, the lower substrate 10 may include a printed circuit board which may be formed with a plurality of patterns or a silicon substrate which may have circuit patterns, and may be formed of a flexible substance. At least one light emitting part 12 for emitting light according to an applied signal may be mounted onto the lower substrate 10. A dielectric layer 11 (as seen in FIGS. 1, 2, 5, and 6) may be formed on the upper surface of the lower substrate 10 to substantially expose the light emitting part 12 so as to substantially protect the patterns (not shown).

Two or more semiconductor chips 20 may be stacked over the lower substrate 10. In each semiconductor chip 20, a via hole 21 may be defined at a position substantially corresponding to the light emitting part 12, and a light receiving part 22 may be mounted to the sidewall of the via hole 21. The light receiving part 22 may receive a signal from an electrowetting liquid lens 31 which will be described later.

The upper substrate 30 has an upper surface and a lower surface which may generally face away from the upper surface. The upper substrate 30 may be attached to the semiconductor chip 20 positioned generally at the uppermost point among the plurality of stacked semiconductor chips 20. For example, the upper substrate 30 may include a printed circuit board with generally a flat plate-like shape or a silicon substrate with circuit patterns. The upper substrate 30 may be substantially formed of a flexible substance.

The electrowetting type liquid lens 31 may be disposed generally on the lower surface of the upper substrate 30 at a position corresponding to the via hole 21. That is to say, the electrowetting liquid lens 31 may be mounted in such a way as to generally face the light emitting part 12 through the via hole 21.

The electrowetting type liquid lens 31 may perform an autofocusing function by using a curvature variation of a lens. The curvature variation of the lens in the liquid lens 31 may be caused by an electrowetting phenomenon. An electrowetting technology may be defined by example. For example, in a state in which a conductive liquid and a nonconductive liquid come into substantial contact with each other on an electrode coated with an insulating substance, a voltage may be applied to the electrode and the conductive liquid from an outside to control the surface tension of the conductive liquid such that the contact angle of the conductive liquid and the shape of the interface of the two liquids may be changed.

The multi-chip package according to the present invention may further include a controller (not shown) for controlling the voltage applied to the electrowetting liquid lens 31. While the mounting position of the controller may not specifically be limited, the controller may be mounted to the lower substrate 10 or the upper substrate 30 for the sake of miniaturization of the package.

The external connection terminals 40 may include, for example, solder balls.

Such a multi-chip package may be manufactured through, for example, a manufacturing procedure shown in FIGS. 2 to 6. The functions thereof will be described together.

Figure 2:
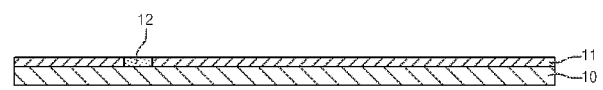
FIGS. 2 to 6 are cross-sectional views sequentially illustrating an example of a method for manufacturing a stacked semiconductor package in accordance with the embodiment of the present invention.

FIG. 2 shows the lower substrate 10 which may be applied to the multi-chip package. The light emitting part 12 may be attached to the first surface, that is, the upper surface, of the lower substrate 10. A position at which the light emitting part 12 may be attached to the lower substrate 10 may be a position in which light may be supplied through the via hole 21 of the semiconductor chip 20.

The light emitting part 12 may include a light emitting, for example, an infrared emission, etc. Since the light emitting may correspond to a special LED (light emitting diode) for emitting infrared, it may have the characteristics of a diode as they are. That is to say, when the voltage applied to the light emitting and the polarity of the light emitting correspond to each other, infrared may be substantially emitted, otherwise infrared may not be emitted.

Figure 3:

FIG. 3 illustrates the semiconductor chip 20 which may be applied to the multi-chip package. The semiconductor chip 20 may be provided in plural, and at least one via hole 21 may be defined in each semiconductor chip 20 at the substantially the same position. The via hole 21 may serve as a signal transfer path for the light emitting part 12, the light receiving part 22 and the electrowetting type liquid lens 31. The light receiving part 22 may be attached to the sidewall of the via hole 21 of the semiconductor chip 20.

The light receiving part 22 may include a light receiving sensor, for example, an infrared sensor. The light receiving sensor may sense a light receiving degree by a suing principle that an amount of current changes depending upon an amount of received infrared.

Figure 4:
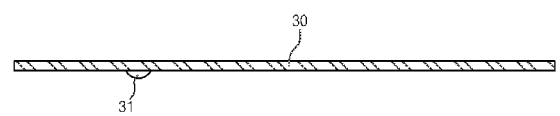

FIG. 4 illustrates the upper substrate 30 which may be applied to the multi-chip package. The electrowetting type liquid lens 31 may be attached to the second surface, that is, the lower surface, of the upper substrate 30. The electrowetting type liquid lens 31 may be changed in its surface shape depending upon an applied voltage and may transfer the light emitted through the via hole 21 from the light emitting part 12 to the light receiving part 22 which may be attached to at least one semiconductor chip 20 selected among the plurality of semiconductor chips 20.

Figure 5:
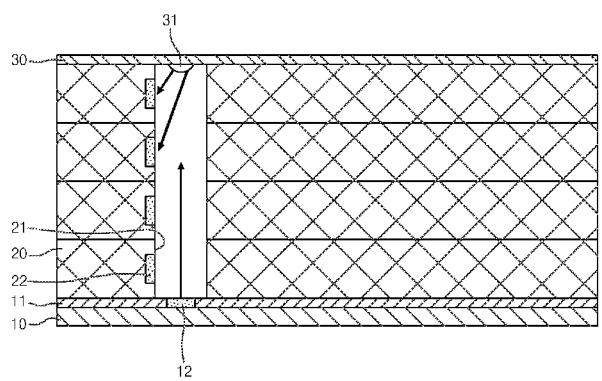
Figure 6:
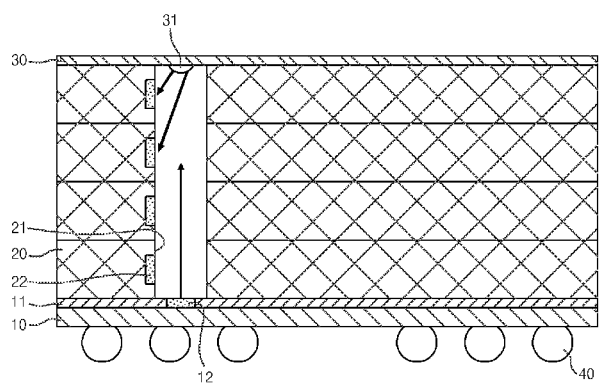

FIGS. 5 and 6 illustrate the multi-chip package according to an embodiment. Here the multi-chip package may be manufactured by sequentially stacking the lower substrate 10, four semiconductor chips 20 and the upper substrate 30. The plurality of stacked semiconductor chips may have via holes 21, which may be substantially at the same position with substantially the same size. These via holes 21 may serve as the signal transfer path for the light emitting part 12, the light receiving part 22, and the electrowetting type liquid lens 31.

For example, when it may be necessary to select a semiconductor chip positioned at substantially the uppermost point among the stacked semiconductor chips, a necessary amount of voltage may be applied to the liquid lens 31 by the controller, and according to the voltage, the liquid lens 31 may be changed in its surface curvature. The light emitting part 12 may emit light to the liquid lens 31, and since the liquid lens 31 may be changed in its surface curvature so as to direct the light to the uppermost semiconductor chip, the light emitted from the light emitting part 12 may be transferred to the light receiving part 22 of the uppermost semiconductor chip 20 by the medium of the liquid lens 31, by which a selection procedure for the uppermost semiconductor chip among the plurality of semiconductor chip may be substantially completed.

The above-described multi-chip package technology may be applied to various kinds of semiconductor devices and package modules having substantially the same.

Figure 7:
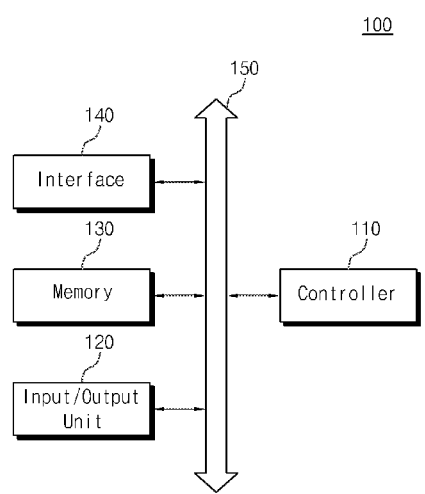
FIG. 7 is a block diagram of an example of an electronic system to which the stacked semiconductor package in accordance with the embodiment of the present invention is applied.

Referring to FIG. 7, the semiconductor package in accordance with the embodiment of the present invention may be applied to an electronic system 100. An electronic system 100 may include a controller 110, an input/output unit 120, and a memory 130. The controller 110, the input/output unit 120 and the memory 130 may be coupled with one another through a bus 150 providing a path through which data move.

For example, the controller 110 may include at least any one of at least one microprocessor, at least one digital signal processor, at least one microcontroller, and logic devices capable of performing the same functions as these components. The controller 110 and the memory 130 may include at least any one of the semiconductor package according to the embodiment of the present invention. The input/output unit 120 may include at least one selected among a keypad, a keyboard, a display device, and so forth. The memory 130 may be a device for storing data. The memory 130 may store data and/or commands to be executed by the controller 110, and the like.

The memory 130 may include a volatile memory device such as a DRAM and/or a nonvolatile memory device such as a flash memory. For example, a flash memory may be mounted to an information processing system such as a mobile terminal or a desk top computer. The flash memory may be constituted by a semiconductor disc device (SSD). In this case, the electronic system 100 may stably store a large amount of data in a flash memory system.

The electronic system 100 may further include an interface 140 configured to transmit and receive data to and from a communication network. The interface 140 may be a wired or wireless type. For example, the interface 140 may include an antenna or a wired or wireless transceiver. Further, the electronic system 100 may be additionally provided with an application chipset, a camera image processor (CIS), an input/output unit, etc.

The electronic system 100 may be realized as a mobile system, a personal computer, an industrial computer or a logic system performing various functions. For example, the mobile system may be any one of a personal digital assistant (PDA), a portable computer, a web tablet, a mobile phone, a wireless phone, a laptop computer, a memory card, a digital music system and an information transmission/reception system, etc. In the case where the electronic system 100 is an equipment capable of performing wireless communication, the electronic system 100 may be used in a communication system such as of CDMA (code division multiple access), GSM (global system for mobile communication), NADC (north American digital cellular), E-TDMA (enhanced-time division multiple access), WCDAM (wideband code division multiple access) and CDMA2000, etc.

Figure 8:
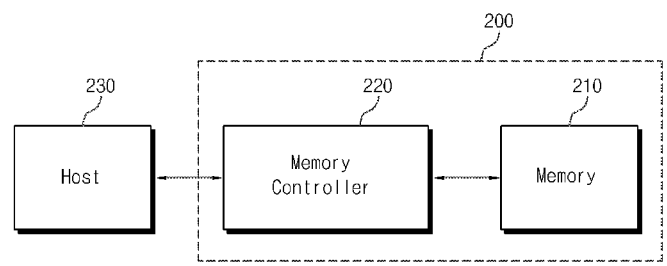
FIG. 8 is a block diagram illustrating an example of a memory card to which the stacked semiconductor package in accordance with the embodiment of the present invention is applied.

Referring to FIG. 8, the semiconductor package in accordance with the embodiment of the present invention may be provided in the form of a memory card 200. For example, the memory card 200 may include a memory 210 such as a nonvolatile memory device and a memory controller 220. The memory 210 and the memory controller 220 may store data or read stored data.

The memory 210 may include at least any one among nonvolatile memory devices to which the packaging technology of the embodiments of the present invention may be applied. The memory controller 220 may control the memory 210 such that stored data is read out or data is stored in response to a read/write request from a host 230.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A multi-chip package comprising:
a lower substrate;
at least two semiconductor chips stacked over the lower substrate and each defined with a via hole;
an upper substrate coupled to a semiconductor chip positioned uppermost among the semiconductor chips;
a light emitting part coupled to the lower substrate corresponding to the via hole;
an electrowetting liquid lens coupled to a lower surface of the upper substrate for receiving a signal transferred from the light emitting part through the via hole;
a light receiving part coupled to a sidewall of the via hole of each semiconductor chip configured to receive a signal from the electrowetting liquid lens.

2. The multi-chip package according to claim 1, further comprising:
a controller configured to control a voltage applied to the electrowetting liquid lens.

3. The multi-chip package according to claim 1, wherein the upper substrate and the lower substrate include at least one of a printed circuit board and a silicon substrate having circuit patterns.

4. The multi-chip package according to claim 3, wherein the lower substrate is formed of a flexible substance.

5. The multi-chip package according to claim 1, further comprising: external connection terminals coupled to the lower substrate.

6. The multi-chip package according to claim 5, wherein the external connection terminals comprise solder balls.

7. The multi-chip package according to claim 1, wherein the light emitting part comprises an infrared emission.

8. The multi-chip package according to claim 1, wherein the light receiving part comprises an infrared sensor.

9. The multi-chip package according to claim 1, wherein the via holes are substantially the same size.

* * * * *